United States Patent [19]
Casper et al.

[11] Patent Number: 5,656,967
[45] Date of Patent: Aug. 12, 1997

[54] TWO-STAGE FUSIBLE ELECTROSTATIC DISCHARGE PROTECTION CIRCUIT

[75] Inventors: Stephen L. Casper; Manny Ma, both of Boise, Id.

[73] Assignee: Micron Technology, Inc., Boise, Id.

[21] Appl. No.: 511,650

[22] Filed: Aug. 7, 1995

[51] Int. Cl.⁶ .................................................. H02H 7/20
[52] U.S. Cl. ........................ 327/525; 327/478; 361/56
[58] Field of Search ............................. 361/56, 91, 111, 361/58; 327/525, 478, 517, 378, 379, 309, 362, 432

[56] References Cited

U.S. PATENT DOCUMENTS

| | | | |
|---|---|---|---|
| 4,692,781 | 9/1987 | Rountree et al. | 357/23.13 |
| 4,736,271 | 4/1988 | Mack et al. | 327/525 |
| 4,875,130 | 10/1989 | Huard | 361/56 |
| 4,894,791 | 1/1990 | Jiang et al. | 364/570 |
| 4,947,060 | 8/1990 | Hoberman et al. | 327/525 |
| 5,100,829 | 3/1992 | Fay et al. | 437/60 |
| 5,195,010 | 3/1993 | Dresner | 361/56 |
| 5,303,402 | 4/1994 | McLaughlin et al. | 327/525 |
| 5,341,267 | 8/1994 | Whitten et al. | 361/56 |

FOREIGN PATENT DOCUMENTS

| 2041850 | 3/1977 | Japan | 327/525 |
|---|---|---|---|

OTHER PUBLICATIONS

Walter Bucksch, "ESD Protection Circuit for Linear Bipolar ICs", *Texas Instruments Technical Journal*, vol. 3, No. 5, p. 22, (Sep.–Oct. 1986).

Chong Ming Lin, et al., "A CMOS VLSI ESD Input Protection Device, DIFIDW", pp. 202–209 no date.

*Primary Examiner*—Timothy P. Callahan
*Assistant Examiner*—Eunja Shin
*Attorney, Agent, or Firm*—Schwegman, Lundberg, Woessner & Kluth, P.A.

[57] ABSTRACT

An electrostatic discharge (ESD) protection circuit includes two stages. A first stage is operatively coupled to a metal bonding pad. This first stage is an npn transistor having a low resistance fusible element which has a fast response time. A second stage is operatively coupled in series to the first stage. The second stage provides a high-resistance path to protect the npn transistor after the fusible element has fused to into a high resistance voltage path. In addition, a semiconductor device having internal circuitry protected by this two stage ESD protection circuit is provided. The ESD protection circuit is operatively coupled between the bonding pad which is located external to the semiconductor device and the internal circuitry.

19 Claims, 3 Drawing Sheets

TWO-STAGE FUSIBLE ELECTROSTATIC DISCHARGE PROTECTION CIRCUIT

FIELD OF THE INVENTION

The present invention relates generally to semiconductor devices. More particularly, the present invention relates to electrostatic discharge protection circuits for bonding pads and interface terminals of semiconductor devices.

BACKGROUND OF THE INVENTION

Metal-oxide-semiconductor (MOS) devices typically employ protection circuits at the bonding pads (i.e., input and output terminals to prevent damage to the internal circuitry caused by electrostatic discharge (ESD). An electrostatic voltage is discharged by a very rapid current spike with very high peak current but short duration. Usually the voltage level which these protection circuits will withstand is about 3,000 volts. Voltages of this magnitude are easily generated by friction in routine handling, so special precautions have been needed to keep all of the MOS device terminals grounded or shorted together to avoid damage due to these electrostatic voltage build-ups.

Therefore, a need exists for improved ESD protection for MOS integrated circuits that can withstand more than 3,000 volts ESD. In particular, it is desirable to provide ESD protection up to 8,000 to 10,000 volts.

U.S. Pat. No. 4,692,781 issued Sep. 8, 1987, entitled "Semiconductor Device With Electrostatic Discharge Protection" by Rountree et al describes an ESD protection circuit for a MOS device. The described protection circuit uses a thick-oxide transistor connected between a metal bonding pad and ground. The channel width of this transistor is chosen to be sufficient to withstand large, short duration current spikes caused by electrostatic discharge. The spacing between a metal-to-silicon contact to the drain of this transistor (which connects to the internal circuitry of the MOS device) and the channel of the transistor (where most of the heat is generated), is chosen to be much larger than usual (e.g., two to three times) to prevent the metal contact from being melted by heat propagating along the silicon surface during the EDS current spike. A similar spacing feature is also applied to circuits for output pads, or circuits using diode protection devices.

The above described protection device employs two transistors as part of the protection device. As a result, the size of the overall integrated circuit is increased, as well as the complexity and manufacturing costs.

SUMMARY OF THE INVENTION

The present invention relates to a fusible ESD protection mechanism having two stages implemented at an input and/or output pad of a semiconductor device (e.g., very-large-scale integrated (VLSI) circuits). A first stage having a low resistance fusing circuit is used to provide a fast fusing response time to discharge ESD events. After the fusible element is fused, a second stage having a high resistance discharge path is used to provide secondary protection.

According to one implementation, the low resistance path may be implemented using a fusible element (formed, for example, by a metallized region) having a shape designed to fuse when a sufficiently high electrostatic voltage charge is incident on the bonding pad. The high resistance path may be implemented using a current-shunting circuit having a threshold point at which a high electrostatic voltage charge causes the circuit to activate and shunt current away from the semiconductor circuitry to which the input and/or output pad connects.

The above summary is not intended to describe all of the objects and features of the present invention. Various other related objects and features, as well as advantages of the present invention, will be apparent upon reading the following detailed description and review of the associated drawings.

BRIEF DESCRIPTION OF THE DRAWINGS

The present invention will be described with reference to the accompanying drawings, wherein like reference numerals identify like components.

In the drawings.

Figure 1:
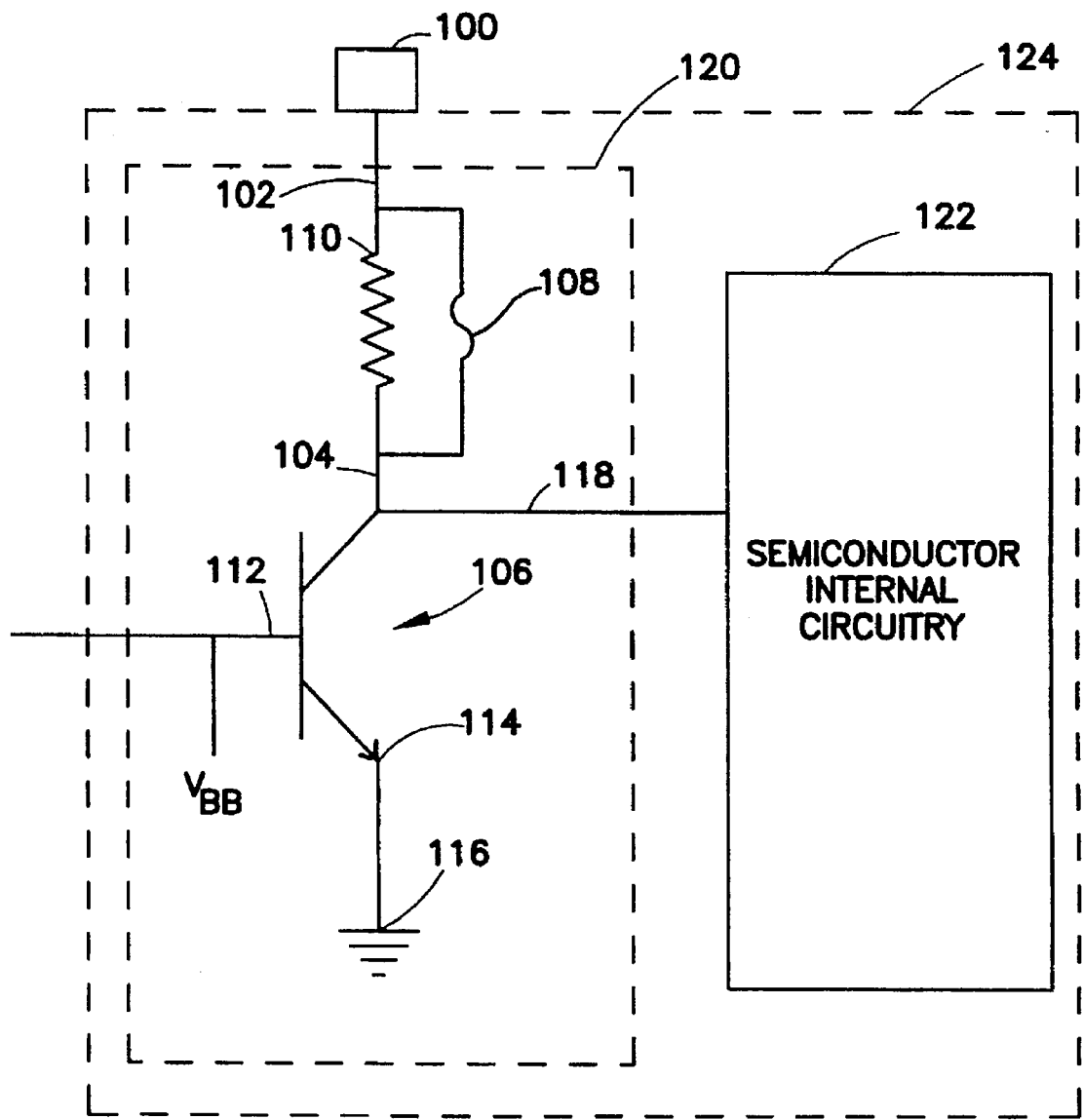
FIG. 1 is an electrical schematic diagram of an embodiment ESD protection circuit, illustrated in accordance with the present invention.

While the invention is susceptible to various modifications and alterative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

Figure 2:
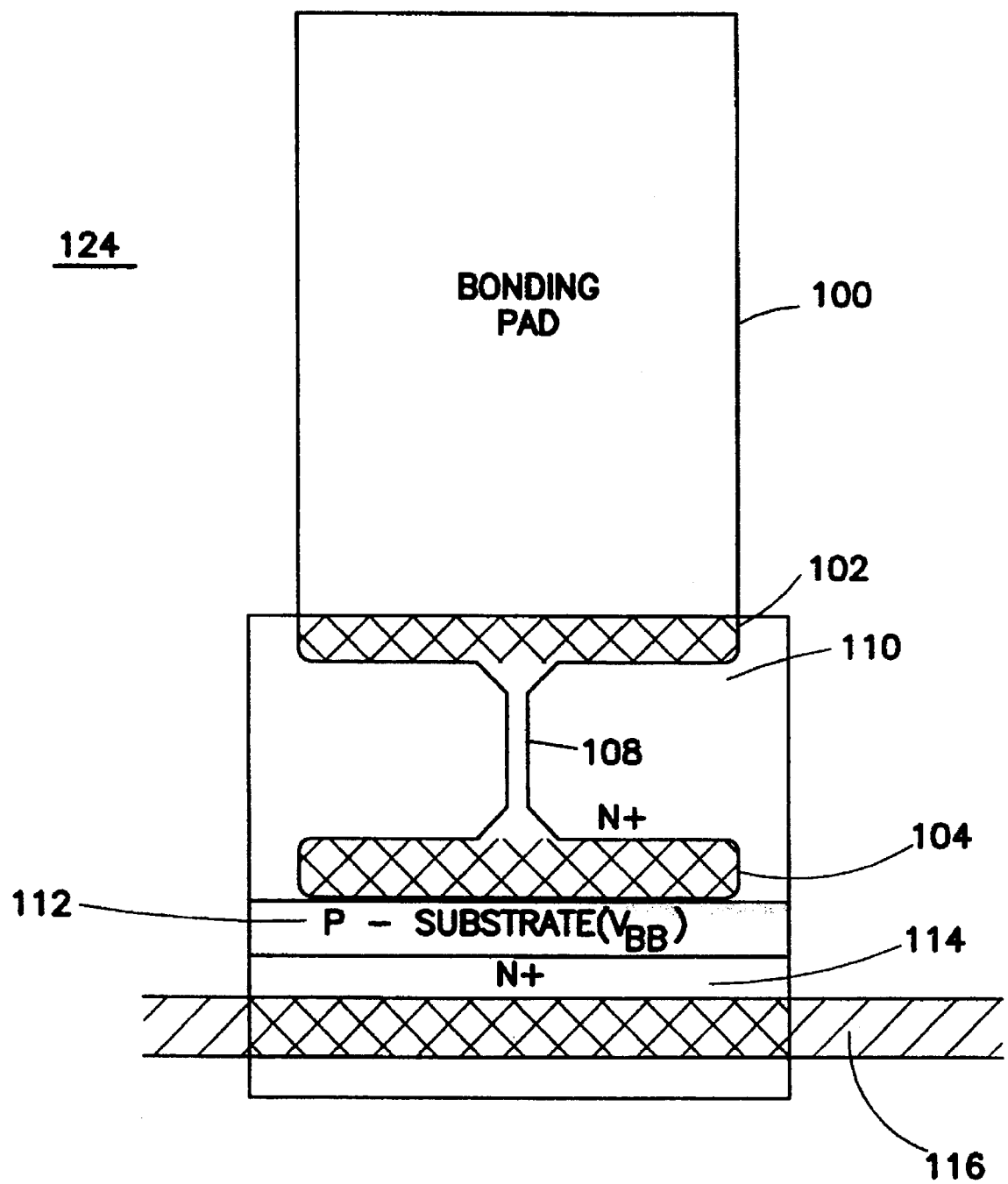
FIG. 2 is a plan view of a portion of a semiconductor device having the embodiment ESD circuit shown in FIG. 1.

Referring now to FIGS. 1 and 2, a circuit 120 is described for providing ESD protection to internal circuitry 122 of a semiconductor chip 124. Because implementation of the internal circuitry 122 (typically a MOS device) is not critical to the invention, it will not be discussed further. Rather, discussion is properly directed to the ESD protection circuit 120, which is illustrated in accordance with a preferred implementation of a metal bonding pad 100 connected to a metal conductor 102 which is connected to a collector region 104, of a collector formed as part of a transistor 106, via a fusible element 108. The metal conductor 102, collector region 104, transistor junction region (hereafter "transistor") 106 and fusible element 108 all contribute to providing the ESD protection circuit 120.

The ESD protection circuit 120 may be viewed as including a first and a second stage, which are formed around the transistor 106. As described more fully below, the first stage, which includes fusible element 108, operates during typical circuit operating conditions for the semiconductor chip 124. The second stage is formed when the first stage is exposed to a voltage charge spike from an ESD event sufficient to fuse (or melt) the fusible element 108. In the second stage, the collector region 104 of transistor 106 is connected to the metal conductor 102 via a high resistance path 110 formed by the $n^+$ diffusion region of the collector.

The first stage is illustrated in FIG. 2. In the first stage, the protection device 120 is formed of a lateral npn transistor 106 in which a low resistance fusible element 108 (e.g., a thin metallized region connecting the metal conductor (or contact area) 102 to the collector region 104) having a fast response time is provided. The length of the fusible element 108 passes through the active n+ diffusion region 110 (which also serves as the high resistance path in stage two as described below) of the npn transistor 106. Fusible element 108 conducts a voltage charge presented to bonding pad 100 (via metal conductor 102) to the collector region 104 of transistor 106.

During normal operations of the first stage, transistor 106 is reversed-biased, with the base of the transistor being controlled to hold $V_{BE}$ (the voltage between the base 112 and the emitter 114 of transistor 106) less than about 0.7 volts. In the illustrated embodiment, the emitter 114 is connected to common 116. By way of example, in a semiconductor device operating on a 5 volt supply, $V_{BB}$ is approximately −1 volts. Thus, $V_{BB}$, which is the voltage set for the p-substrate, controls the base of the transistor 106 in the reverse-bias condition until a sufficiently high voltage at the pad 100 forces the forward-bias condition through the collector of the transistor 106.

Accordingly, in this configuration, transistor 106 activates and conducts a current to common 116 when the voltage level at the collector 104 reaches the bias voltage threshold. For example, the collector 104 being subjected to a high-level voltage spike forces the transistor 106 to quickly activate and carry the resultant (charge spike) current through emitter 114 to common 116 and away from the internal circuitry 122. Otherwise, if the voltage level at the collector 104 does not reach the prescribed threshold (i.e., under normal operating conditions), then the charge at the collector is conducted through conductor 118 to the internal circuitry 122.

As shown in the figures, the fusible element 108 is located in an n+ diffusion region and consists of a metallized region of material. The fusible element 108 may be implemented using a geometric shape (e.g., an I-bar shape) which is selectively designed to fuse when an electrostatic voltage charge on the bonding pad reaches a specified level (for example, between 3,000 volts and 10,000 volts). In this manner, upon fusing of the fusible element 108, the circuit including the transistor 106 is converted into the second stage with the high resistance voltage path 110 remaining to couple the collector region 104 to the metal conductor 102.

By way of example, the dimensions and shape of the fusible element 108 can be selected such that the fusible element 108 fuses into the high resistance voltage path 110 when 8,000 volts to 10,000 volts are input on the bonding pad 100. The transistor 106 and associated structure may be constructed with the active $n^+$ diffusion region 110 being about 100 microns wide. The metal conductor 102, the collector region 104 and the metallized region of the fusible element 108 may be constructed to form an I-shaped pattern, with the metallized region being varied in dimensions and material type for the desired fusing reaction. For example, the metallized region may have a width (and height) of about 0.5 to 1 micron, and a length 5–10 microns. The fusible element 108 may be implemented any of a variety of materials, including alloys, such as aluminum-copper.

Figure 3:
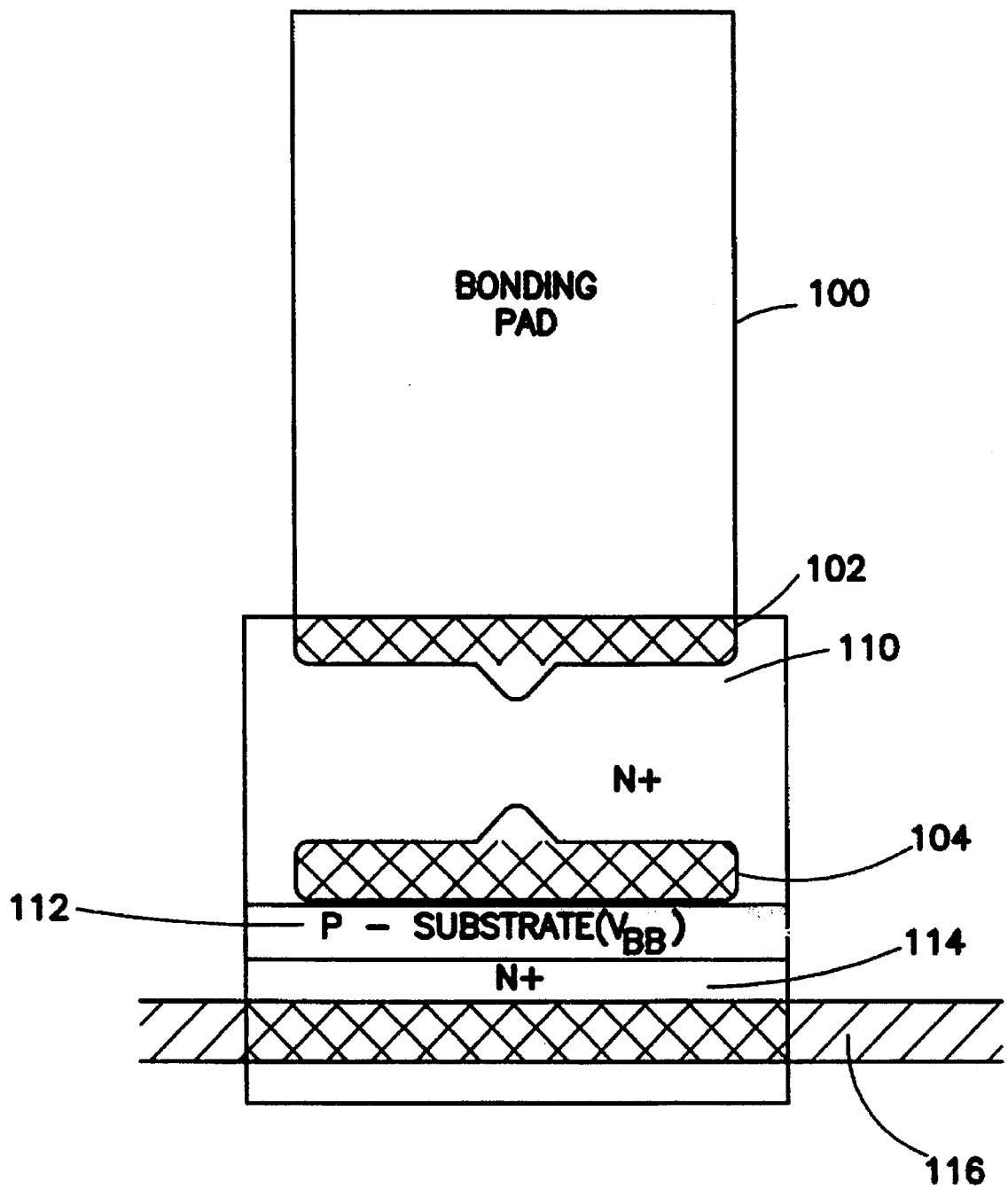
FIG. 3 is a plan view of a portion of a semiconductor device having the embodiment ESD circuit shown in FIG. 1 where a fusible element has fused.

As described above, when a sufficiently high voltage spike is present on bonding pad 100, fusible element 108 quickly fuses to produce the structure illustrated in FIG. 3. As a result, the high resistance voltage path 110 of the active $n^+$ diffusion connects the bonding pad 100 and the collector region 104 of transistor 106. The resulting structure forms the second stage of the ESD protection circuit 120. By comparing FIGS. 2 and 3, it should be apparent that the same basic structure forms the second stage. The first and the second stages may be considered as being operatively connected (in series) since they share transistor parts in common as described above.

The second stage of the ESD circuit 102, acts as a current limitation path, to prevent damage to the ESD transistor (or semiconductor switching circuit). The high resistance voltage path 110 is formed, in the exemplary embodiment, using the active $n^+$ collector region of the lateral npn device, transistor 106. In the second stage, the device operation is as depicted in FIG. 1, except with the fusible element 108 removed due to fusing (as shown in FIG. 3 ).

In this second-stage configuration, the transistor 106 activates and conducts current to common 116 in response to voltage levels at the collector 104 being sufficiently high. For example, if the collector 104 is subjected to a high voltage spike, the transistor. 106 activates to carry the spike current through the emitter 114 to common 116 and away from the internal circuitry 122. Otherwise, if the voltage level at the collector 104 does not reach the threshold, (i.e., is within normal operating conditions), then the voltage charge at the collector is conducted through conductor 118, via the resistor 110 (or the fusible element if fusing has not occurred), to the internal circuitry 122. Due to the high resistance path, the response time of the second stage is slower than that of the first stage.

As the above description illustrates, a spike charge initially diffuses through the low resistance path of the metallized region forming the fusible element 108 (i.e., the first stage) providing a fast response protection circuit to direct the charge through the transistor 106 to ground. If high currents cause the fusible element 108 to fuse (forming the second stage), a spike charge is then directed along the high resistance path 110 of the n+ diffusion region. In the second stage, a spike activates the transistor 106 less quickly than the first stage but still provides discharge protection. It is noted that, in either stage, the same path through emitter 114 to common is used to conduct the voltage charge spike away from the internal circuitry 122 in response to the same voltage being applied to the bonding pad 100. Thus, the two stage protection device can be implemented using basically no more than three components, each of which is inexpensive and commonly implemented; these components are a semiconductor switch device (106), a resistor (110) and a fusible element (108).

These components, implemented as shown in the figures, collectively form the ESD protection circuit 120 which is operatively coupled through conductor 118 to the internal circuitry 122 of the semiconductor device 122. The bonding pad 100, which provides access to the entire semiconductor device 124 and the internal circuitry 122, is operatively coupled in series to the ESD protection circuit 120, which is in turn operatively coupled in series to the internal circuitry 122.

In the manner described above, ESD protection can be provided to a semiconductor device 124. A semiconductor device 124 typically has one or more metal bonding pads 100 located on an external surface of a chip as well as internal circuitry 122 within the chip. An ESD protection circuit 120 may be operatively coupled in series between the bonding pad 100 and the internal circuitry 122 and may be formed internally to the semiconductor device 124. Since the ESD protection device described above may be implemented using a single transistor, the manufacturing complexity and space required for the device is reduced.

While the ESD protection circuit 120 described above is discussed in the context of being connected to an input bonding pad 100, its implementation and/or application can also be used with output pads. Input pads, output pads and pads serving both input and output functions are often referred to generically as "input/output pads".

Although numerous characteristics and advantages of various embodiments of the present invention have been set forth in the foregoing description, together with details of the structure and function of various embodiments of the invention, this disclosure is merely illustrative. Changes and modifications may be made to the embodiments by those skilled in the art. As merely one example, the single transistor implementation can be altered so as to include any number and/or type of semiconductor switching devices. Such changes would not depart from the principles of the present invention, which are set forth in the claims.

What is claimed:

1. An electrostatic discharge protection circuit operatively coupled between a metal bonding pad of a semiconductor device and the internal circuitry of the semiconductor device, the protection circuit comprising:

a transistor having an active diffusion area;

a low resistance fusible element connected across at least a portion of the active diffusion area of the transistor, providing a low resistance discharge path through the transistor when a voltage on the bonding pad reaches a threshold value, the low resistance fusible element fusing to break a connection across the at least a portion of the active diffusion area when an electrostatic voltage on the bonding pad reaches a prescribed value;

wherein the low resistance fusible element is serially coupled between the bonding pad and the internal circuitry; and wherein the active diffusion area forms a high resistance path through the transistor when a voltage on the bonding pad exceeds the threshold value after the fusible element has fused.

2. The electrostatic discharge protection circuit of claim 1, wherein the transistor is an npn bipolar transistor and the active diffusion region is an n+ diffusion region of the npn transistor.

3. The electrostatic discharge protection circuit of claim 2, wherein the n+ diffusion region comprises a collector of the npn transistor.

4. The electrostatic discharge protection circuit of claim 3, wherein the prescribed value of the electrostatic voltage on the bonding pad ranges between 3,000 volts and 10,000 volts.

5. The electrostatic discharge protection circuit of claim 3, wherein the fusible element fuses when the electrostatic voltage on the bonding pad exceeds 8,000 volts.

6. The electrostatic discharge protection circuit of claim 1, wherein the transistor is a lateral bipolar transistor.

7. A semiconductor device, comprising:

a bonding pad located on an external surface of a chip;

internal circuitry within the chip;

an electrostatic discharge protection circuit, operatively coupled between the bonding pad and the internal circuitry, having a low resistance fusible element forming a discharge path having a fast response time, and an active diffusion region having at least a portion of which connected across the low resistance fusible element, forming a high resistance discharge path with a slower response time upon the fusing of the fusible element wherein said low resistance fusible element is serially coupled between the bonding pad and the internal circuitry; and wherein the electrostatic discharge protection circuit is turned on when a voltage on the bonding pad reaches a threshold value.

8. The semiconductor device of claim 7, wherein the active diffusion region is operatively coupled in parallel with the low resistance fusible element.

9. The semiconductor device of claim 7, wherein the fusible element is located adjacent to the active diffusion region; and wherein the active diffusion region is an n+ diffusion region.

10. The semiconductor device of claim 9, wherein the fusible element comprises a metallized region formed across the n+ diffusion region.

11. The semiconductor device of claim 10, wherein the fusible element has a geometric shape which is designed to fuse when an electrostatic voltage on the bonding pad is between 3,000 volts and 10,000 volts.

12. The semiconductor device of claim 10, wherein the fusible element has height, length, and width dimensions, the width dimension being such that the fusible element fuses when between approximately 8,000 volts to 10,000 volts are present on the bonding pad.

13. An electrostatic discharge protection circuit operatively coupled between a bonding pad of a semiconductor device and internal circuitry of the semiconductor device, the protection circuit comprising:

a semiconductor switching circuit connected to a low resistance fusible element and a high resistance fusible element;

the low resistance fusible element serially coupled between the bonding pad and the internal circuitry;

the high-resistance element connected in parallel across the low resistance fusible element;

the semiconductor switching circuit providing a low resistance discharge path through the low resistance fusible element when a voltage on the bonding pad reaches a threshold value, the low-resistance fusible element fusing when the voltage on the bonding pad reaches a prescribed value; and wherein the high resistance element forms a high resistance path through the semiconductor switching circuit when a voltage on the bonding pad exceeds the threshold value after the low resistance fusible element has fused.

14. The electrostatic discharge protection circuit of claim 13, wherein the semiconductor switching circuit comprises a transistor and wherein the high resistance element is an active diffusion region of the transistor.

15. The electrostatic discharge protection circuit of claim 13, wherein the semiconductor switching circuit comprises a transistor.

16. The electrostatic discharge protection circuit of claim 15, wherein the transistor is a bipolar transistor having a base at a potential equivalent to the potential of a portion of the substrate of the semiconductor device.

17. The electrostatic discharge protection circuit of claim 13, wherein electrostatic charge is discharged through the semiconductor switching circuit.

18. The electrostatic discharge protection circuit of claim 17, wherein the electrostatic charge discharged through the semiconductor switching circuit is in response to the semiconductor switching circuit being activated by an undesired electrostatic voltage at the pad of the semiconductor device.

19. An electrostatic discharge protection circuit, coupled between a bonding pad and the internal circuitry of the semiconductor device, comprising:

a low resistance metal fusible element serially connected between the bonding pad and the internal circuitry;

an npn bipolar transistor having a collector, including an active n+ region, connected to the internal circuitry, and having a base connected to a constant voltage source;

the active n+ region of the collector connected in parallel with the low resistance metal fusible element, forming a resistive element coupled between the bonding pad and the internal circuit; and wherein the npn bipolar transistor is turned on when the voltage on the bonding pad reaches a threshold value.

* * * * *